(12) United States Patent
Lee

(10) Patent No.: US 7,670,147 B1
(45) Date of Patent: Mar. 2, 2010

(54) CAPACITANCE CIRCUIT BOARD SIGNAL-ADJUSTING DEVICE

(75) Inventor: Leo Lee, Pingzhen (TW)

(73) Assignees: Elka International Ltd., Hsichih (TW); Litek Technologies Co., Ltd., Pinzhen (TW)

( * ) Notice: Subject to any disclaimer, the term of this patent is extended or adjusted under 35 U.S.C. 154(b) by 0 days.

(21) Appl. No.: 12/252,421

(22) Filed: Oct. 16, 2008

(51) Int. Cl.
*H01R 12/00* (2006.01)
(52) U.S. Cl. ............. 439/76.1; 439/620.09; 439/620.22
(58) Field of Classification Search ................ 439/76.1, 439/620.09, 620.22
See application file for complete search history.

(56) References Cited

U.S. PATENT DOCUMENTS

| | | | |
|---|---|---|---|
| 7,410,366 B2* | 8/2008 | Wu | 439/76.1 |
| 7,410,367 B2* | 8/2008 | Hashim et al. | 439/76.1 |
| 2005/0221638 A1* | 10/2005 | Berberich | 439/76.1 |
| 2007/0032104 A1* | 2/2007 | Yamada et al. | 439/76.1 |
| 2007/0161269 A1* | 7/2007 | Sugimoto et al. | 439/76.1 |

* cited by examiner

*Primary Examiner*—Ross N Gushi

(57) ABSTRACT

A capacitance circuit board signal-adjusting device, and more particularly, a signal adjusting device capable of increasing the clarity of a high frequency signal; the signal adjusting device includes a circuit board disposed in a connector, a plurality of transmission circuits disposed on the circuit board, one side of the transmission circuit is a signal input terminal and another side thereof is a signal out terminal; it is characterized in that a copper foil in the middle section of transmission circuit is planned in advance to generate a capacitor naturally by breaking off a slit; the capacitor including two parallel sections arranged distantly side by side, a medium disposed between the two parallel sections and two breaches disposed in two directions opposite to each other at two diagonal ends. Whereby, the capacitor naturally generated in the circuit board plus a resistor connected thereto in parallel can constitute a signal filter; it can reduce components, shorten the manufacturing process, reduce the cost and achieve the good signal adjustment effect while being put into practice.

9 Claims, 7 Drawing Sheets

CAPACITANCE CIRCUIT BOARD SIGNAL-ADJUSTING DEVICE

BACKGROUND OF THE INVENTION

1. Field of the Invention

The present invention relates to a capacitance circuit board signal-adjusting device, and more particularly to a circuit board with a broken slit disposed thereon capable of generating a capacitor and a resistor connected thereto used for constituting a signal filter, reducing components effectively, shortening a manufacturing process, reducing the cost and capable of achieving the good signal adjustment effect to increase the transmission quality while being applied.

2. Description of Related Art

The use range of a connector is very large; it is an important bridge for connecting circuits and signals, and an important element for maintaining the normal and stable function of an electronic product. Accompanying the continuous development of electronic products toward lightness, thinness, shortness and smallness, the process capability of an internal system becomes stronger. Recently, structures of new systems such as DVD, HDTV, videophone, video conference, and the like have mostly adopted a complete digitization method to process voice and image information in order to offer users with better quality. The speed of the digital signals transmitted by them is accelerated continuously (the signals may be not compressed). Relatively, it causes the planning and design of the connector to be developed toward "fine interval spacing" and "high frequency".

However, the high-speed transmission will yield matching impedance, crosstalk, transmission delay, signal attenuation, electromagnetic interference, and the like; they cause the image signals or the voice signals easily to yield noise or disconnection while being played; the result is that the listening and viewing quality is reduced substantially. Further, the important data is easy to be lost during the network communication.

To overcome these interference problems, the more advanced design is to integrate resistors, capacitors and filters applied originally on a general printing circuit board (PCB) on a connector, for example, Taiwan Patent No. M280599 discloses a signal adjustment in which a filtering device constituted by a plurality of sets of resistor and capacitor connected in parallel are disposed on a transmission circuit of an internal circuit of a connector thereby achieving the practical purpose of reducing interference effectively.

However, the problem cannot be ignored is that the manufacturing cost will be increased much higher relatively because the plurality of sets of resistor and capacitor are added in the internal structure; it is very unfavorable for a product on a petty profit market competition; this is its main deficit.

SUMMARY OF THE INVENTION

Seeing this, the present invention proposes capacitance circuit board signal-adjusting device, capable of using a broken slit on a copper foil of a circuit board to generate a capacitor naturally and a resistor connected thereto in parallel thereby reducing components effectively, reducing the manufacturing processes, reducing the cost and achieving the good signal adjustment to increase the transmission quality while being put into practice.

To achieve the object mentioned above, the present invention proposes a capacitance circuit board signal-adjusting device, and more particularly, a signal adjusting device capable of increasing the clarity of a high frequency signal; the signal adjusting device includes a circuit board disposed in a connector, a plurality of transmission circuits disposed on the circuit board, one side of the transmission circuit is a signal input terminal and another side thereof is a signal out terminal; it is characterized in that a copper foil in the middle section of transmission circuit is planned in advance to generate a capacitor naturally by breaking off a slit; the capacitor including two parallel sections arranged distantly side by side, a medium disposed between the two parallel sections and two breaches disposed in two directions opposite to each other at two diagonal ends. Whereby, the capacitor naturally generated in the circuit board plus a resistor connected thereto in parallel can constitute a signal filter; it can reduce components, shorten the manufacturing process, reduce the cost and achieve the good signal adjustment effect while being put into practice.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
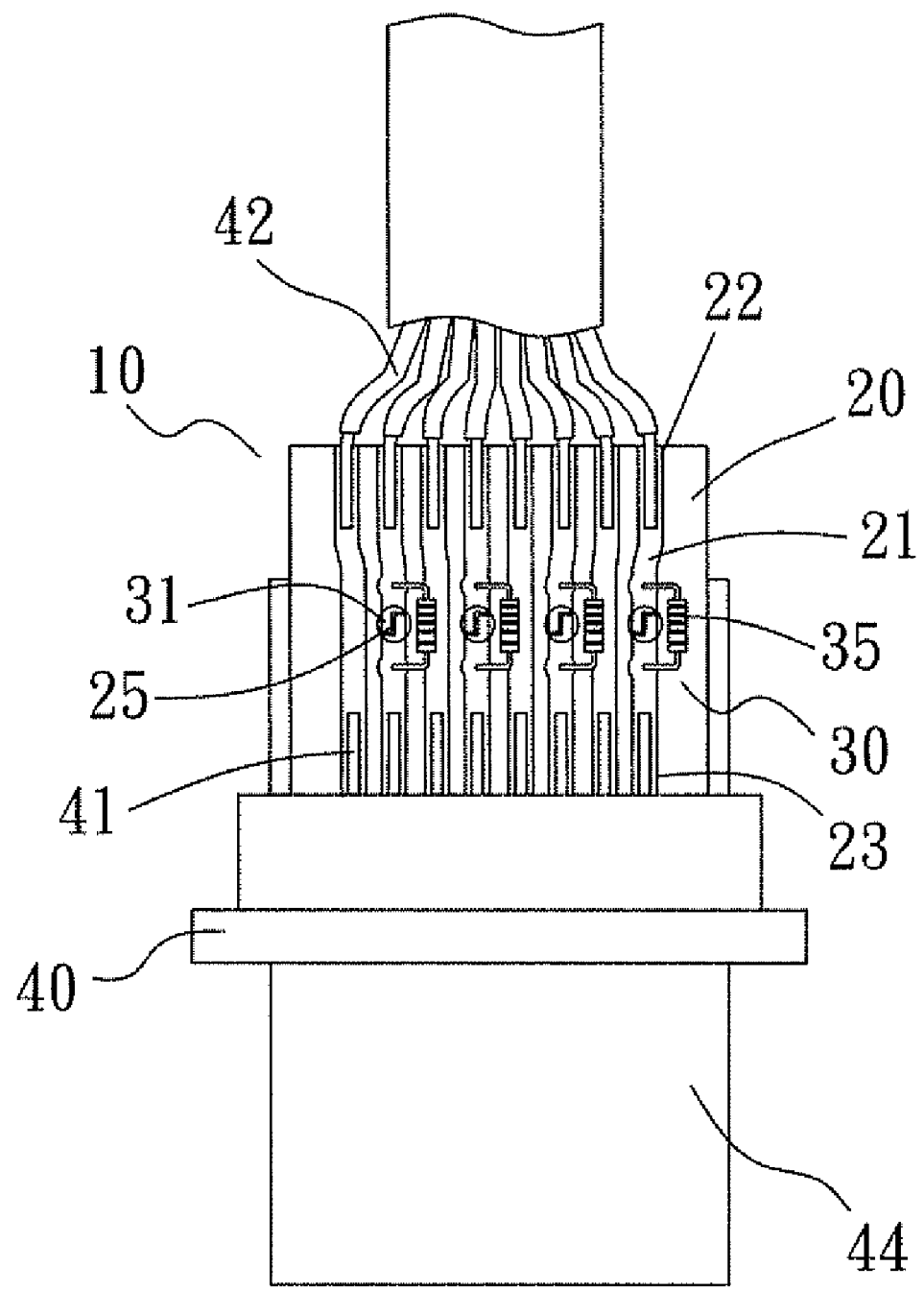
FIG. 1 is a plane view of a capacitance circuit board signal-adjusting device according to the present invention.
Figure 2:
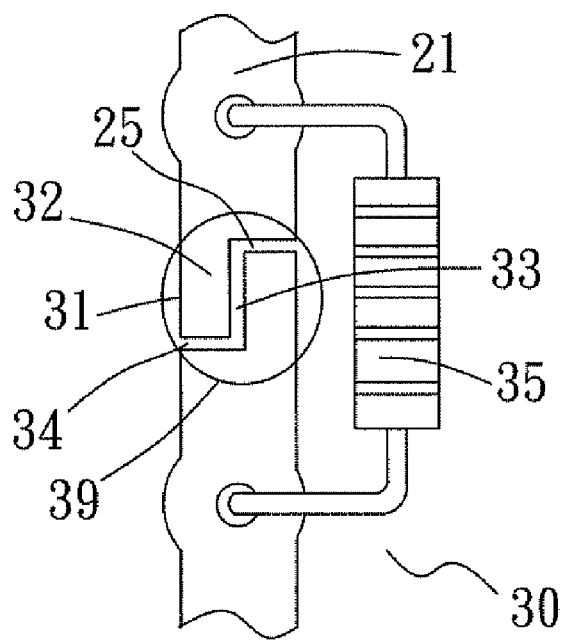
FIG. 2 is a partly enlarged view of a filter according to the present invention.
Figure 3:
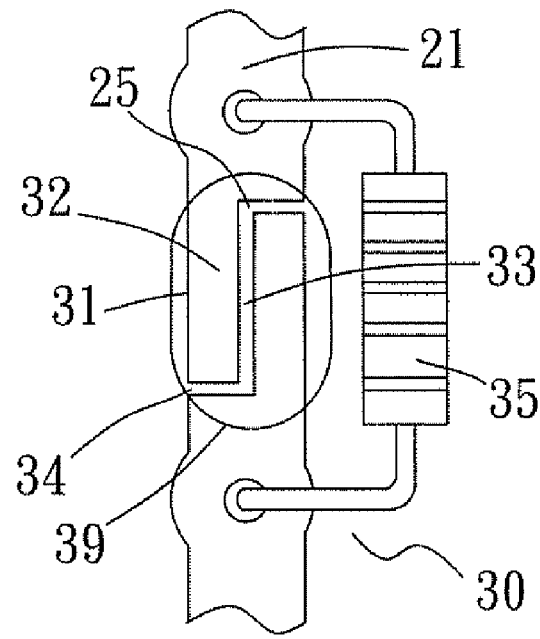
FIG. 3 is a partly enlarged view of a dimension-variable capacitor according to the present invention.

Please refer to FIGS. 1 to 8. A capacitance circuit board signal-adjusting device 10 according to the present invention includes a circuit board 20, and a plurality of transmission circuits 21 are disposed on the circuit board 20, where one side of the transmission circuits 21 is taken as a signal input terminal 22 and another side thereof is taken as a signal output terminal 23; it is characterized in that the transmission circuit 21 is planned in advance to generate a capacitor 31 naturally on a middle copper foil by breaking off a slit 25; while being put into practice, as FIGS. 2 and 3 show, the capacitor 31 includes two parallel sections 32 arranged distantly side by side, a medium 33 disposed between the parallel sections with two ends of the medium 33 being joined to an end of the respective parallel section for partitioning them and a breach 34 is disposed at another end of the respective parallel section, where the capacitance is smaller if the width, of the broken slit 25 is larger and the capacitance is larger if the length of the parallel section 32 is larger. Thus, the size of the capacitor 31 may be planned in advance depending on a different use and specification. Generally, the capacitance set between 1p and 30p is the best (p is an abbreviation of Pico farads, a unit of the capacitance).

Figure 4:
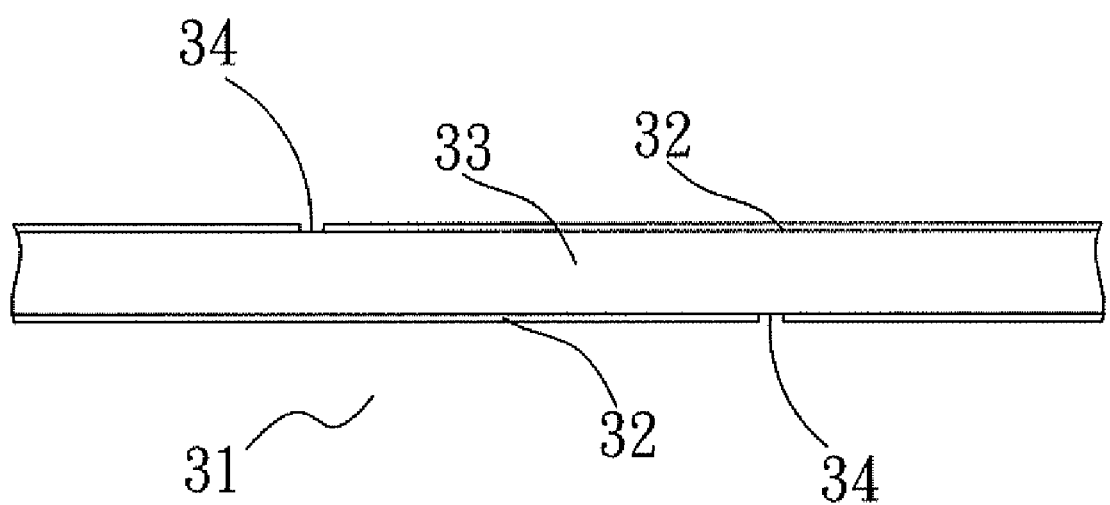
FIG. 4 is a cross sectional view, showing capacitors disposed on different layers according to the present invention.
Figure 5:
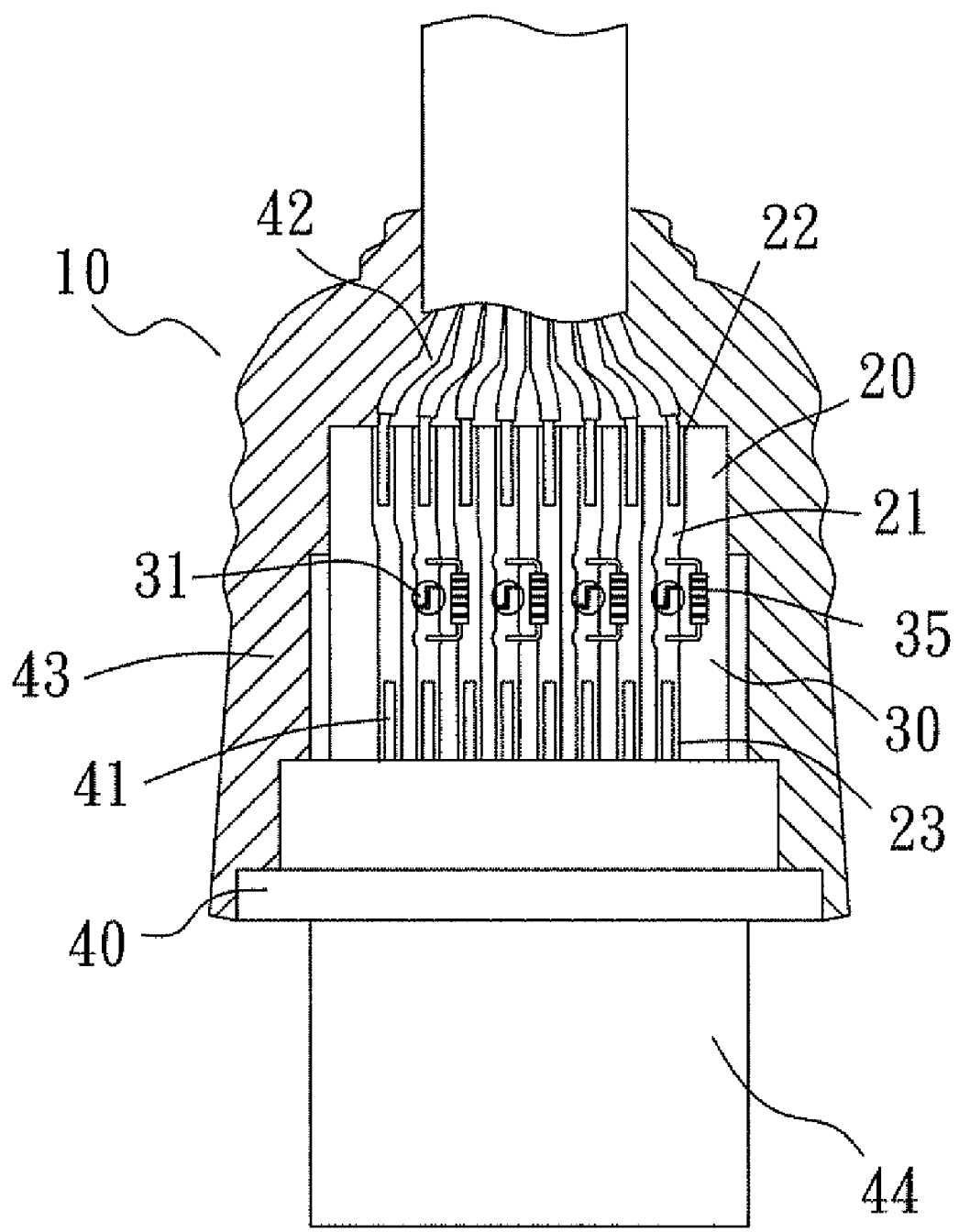
FIG. 5 is across sectional view, showing a cable connector made from a capacitance circuit board signal-adjusting device according to the present invention.

Furthermore, please refer to FIGS. 2 and 3. The broken slit 25 at the middle section of the copper foil may be disposed a Z-shaped distribution, and the breaches 34 at the two ends and the parallel sections 32 disposed distantly side by side are at the same plane. Otherwise, as FIG. 4 shows, the circuit board 20 may also be disposed as a Z-shaped distribution, but the breaches 24 at the two ends and the parallel sections 32 are then positioned on different layers. Further, the two capacitors respectively in the aforementioned embodiments positioned on the copper foil face of a surface layer may all be covered with spot glue 39.

Whereby, it ensures that a signal filter 30 can be formed only if a resistor 35 is connected in parallel extraordinarily to the capacitor 31 while the circuit board 20 is manufactured. Therefore, it can reduce components effectively, shorten the manufacturing processes, reducing the cost and achieve the good signal adjustment effect.

Please refer to FIGS. 1 to 5. The capacitance circuit board signal-adjusting device 10 may be assembled onto a cable connector 40 directly while being manufactured, and a circuit board 20 is buried into the cable connector 40 to allow an output terminal 23 of the transmission circuit 21 to be electrically connected to an output terminal 41 of the connector 40 and an input terminal 22 at another side of the transmission circuit 21 to be electrically connected to a cable 42. The circuit board 20 is positioned inside the cable connector 40, and an outer cover 43 made from a plastic material is disposed outside the cable connector 40. Further, at least one output terminal 44 is disposed on one end of the outer cover 43.

Figure 6:
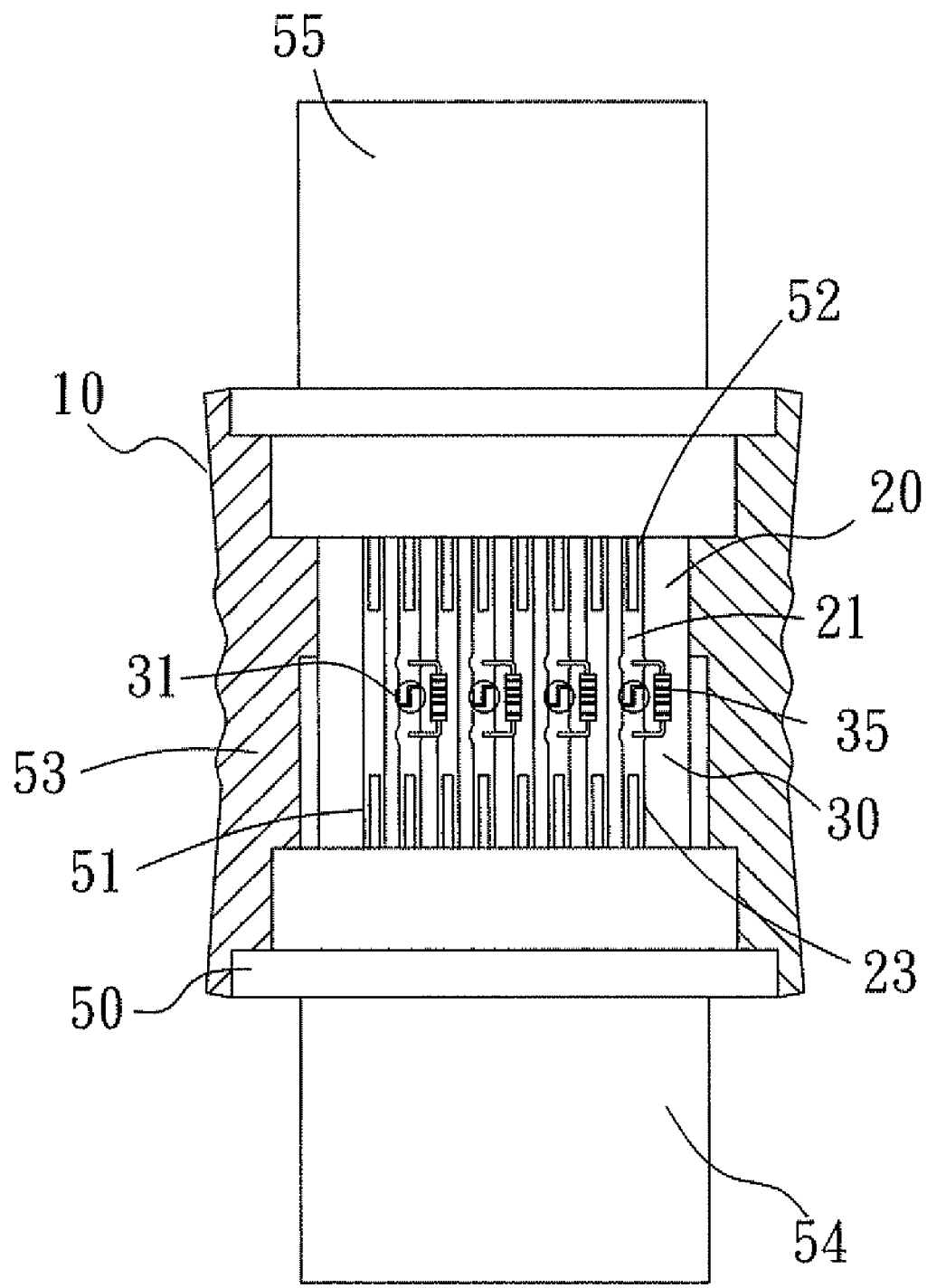
FIG. 6 is crossing sectional view, showing a connector adapter made from a capacitance circuit board signal-adjusting device according to the present invention.
Figure 7:
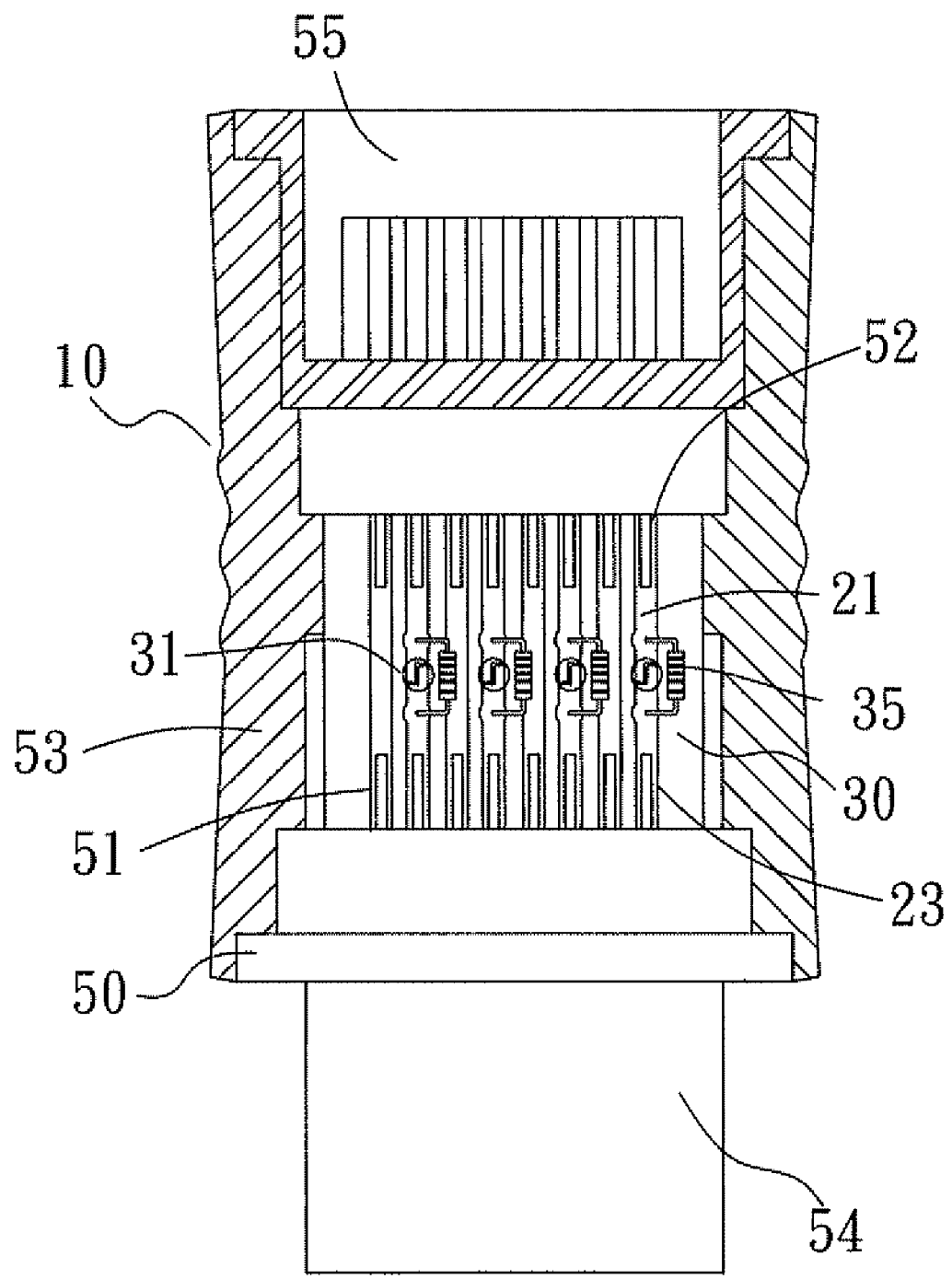
FIG. 7 is a cross sectional view of another kind of Connecter adaptor according to the present invention.
Figure 8:
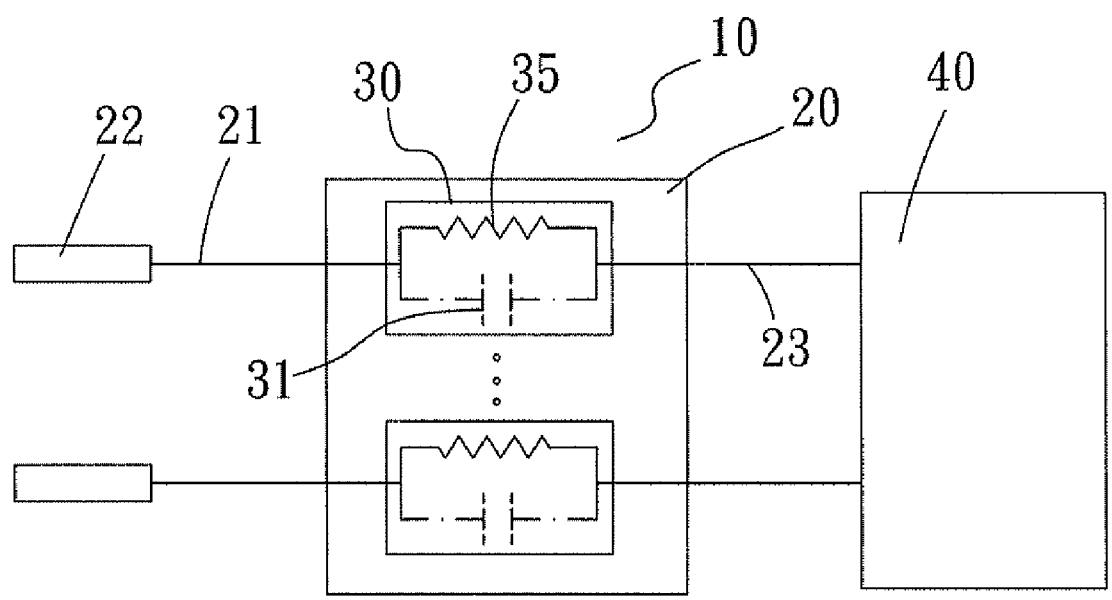
FIG. 8 is a circuit diagram, showing a capacitance circuit board signal-adjusting device according to the present invention.

Furthermore, the capacitance circuit board signal-adjusting device 10, as FIGS. 6 and 7 show, may also be disposed on a connector adapter 50, and the circuit board 20 is buried into the connector adapter 50 to allow the output terminal 23 of the transmission circuit 21 to be electrically connected to an output terminal 51 of the connector adapter 50, and the input terminal 22 of the transmission circuit 21 to be electrically connected to an input terminal 52 of the connector adapter 50.

While being assembled, the connector adapter 50 includes the aforementioned inbuilt circuit board 20, an outer cover 53 made from a plastic material and at least one output terminal 54 and input terminal 55.

Wherein, the output terminal 54 and the input terminal 55 at the two ends of the connector adapter 50 may be set to the same type, for example, the both are the same male type (or the same female type) shown in FIG. 6, or the both are different types (one is a male type and another one is a female type) shown in FIG. 7, thereby being convenient for a user to do selections for different types of insertion uses, and allowing a general cable connector to have the functions of the signal-adjusting device 10 of the present invention through the connector adapter 50.

Whereby, as FIGS. 1 to 8 show, while being put into practice, the output terminal 54 or 44 of the connector adapter 50 or the cable connector 40 made from the signal-adjusting device 10 of the present invention may be utilized to connect with a general display device such as liquid crystal television (not shown in the figures) or a signal duplicator such as audio/video facility (not shown in the figures). Therefore, because the dimension of the capacitor 31 in the middle of the transmission circuit 21 on the inbuilt circuit board 20 of the present invention may be planned in advance plus the resistor 35 connected to the capacitor 31 in parallel can constitute the signal filter 30, it is very convenient on the application; the air filter 30 may be chosen depending on the customization to adjust the impedance in accordance with a different size of cable thereby increasing the transmission length of the cable to achieve the impedance matching effect, and further eliminating crosstalk generated from an overlarge frequency width to increase the video/audio signal transmitting quality substantially.

Conclusively, the structure of the present invention is compact and practical and the functions thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitance circuit board signal-adjusting device, and more particularly, a signal adjusting device capable of increasing high-frequency signal clarity, said signal adjusting device comprising a circuit board disposed in a connector, a plurality of transmission circuits disposed on said circuit board, one side of said transmission circuit being a signal input terminal, another side thereof being an output terminal;

wherein, a copper foil at a middle section of said transmission circuit is planned in advance with a broken off slit to generate a capacitor naturally, comprising two parallel sections disposed distantly side by side, a medium with two ends thereof joined to an end of the respective parallel section for separating said two parallel sections and a breach respectively disposed at another end of the respective parallel section, and said capacitor and a resistor connected thereto in parallel constitute a signal filter thereby reducing components effectively, shortening the manufacturing processes, reducing the cost and achieving the good signal adjustment effect while being put into practice.

2. The capacitance circuit board signal-adjusting device according to claim 1, wherein said broken off slit, which is in the middle of said copper foil, is Z-shaped, and the breaches are positioned on the same layer.

3. The capacitance circuit board signal-adjusting device according to claim 1, wherein the circuit board is a multilayer plate, said broken off slit, which is in the middle of said copper foil, is Z-shaped, the breaches are positioned on different layers.

4. The capacitance circuit board signal-adjusting device according to claims 1, wherein the dimension of said capacitor is between 1p and 30p, said connector comprises said inbuilt circuit, an outer cover made from a plastic material and at least one output terminal.

5. The capacitance circuit board signal-adjusting device according to claim 4, wherein spot glue is covered on said capacitor disposed on a copper foil face of a surface layer.

6. The capacitance circuit board signal-adjusting device according to claim 4, wherein said connector is a cable connector, said circuit board is buried inside said cable connector to allow an output terminal of said transmission circuit to be electrically connected to an output terminal of said connector and an input terminal on another side of said transmission circuit to be electrically connected to a cable.

7. The capacitance circuit board signal-adjusting device according to claim 4, wherein said connector is a connector adapter, said circuit board is buried inside said connector adapter to allow an output terminal of said transmission circuit to be electrically connected to an output terminal of said connector adapter and an input terminal on another side of said transmission circuit to be electrically connected to an input terminal of said connector adapter.

8. The capacitance circuit board signal-adjusting device according to claim 7, wherein two ends of said connector adapter are respectively disposed with the same type of terminal.

9. The capacitance circuit board signal-adjusting device according to claim 7, wherein two sides of said connector adapter are respectively disposed with different male and female terminals.

\* \* \* \* \*